US007042732B2

(12) United States Patent
Hung

(10) Patent No.: US 7,042,732 B2
(45) Date of Patent: May 9, 2006

(54) FLEXIBLE AND ROTATABLE WALL-HANGING OPERATION BOX

(76) Inventor: Kuo-Chuan Hung, P.O. Box No. 6-57, Junghe, Taipei 235 (TW)

( * ) Notice: Subject to any disclaimer, the term of this patent is extended or adjusted under 35 U.S.C. 154(b) by 291 days.

(21) Appl. No.: 10/745,550

(22) Filed: Dec. 29, 2003

(65) Prior Publication Data

US 2005/0141204 A1    Jun. 30, 2005

(51) Int. Cl.
*H05K 7/16* (2006.01)

(52) U.S. Cl. .................................... 361/727; 312/223.1
(58) Field of Classification Search ................ 361/727; 312/223.1
See application file for complete search history.

(56) References Cited

U.S. PATENT DOCUMENTS

| 4,346,756 A | * | 8/1982 | Dodd et al. | ................. 165/48.1 |
| 4,476,848 A | * | 10/1984 | Protas | ..................... 126/19 M |
| 6,578,937 B1 | * | 6/2003 | Thoman | ..................... 312/107 |

* cited by examiner

*Primary Examiner*—Yean-Hsi Chang

(57) ABSTRACT

A flexible and rotatable wall-hanging operation box includes an outer housing and an inner housing; and is characterized that, lower two sides at an interior of the outer housing are respectively disposed with a sliding frame and a sliding track, between the left and right sliding tracks are upper and lower trays capable of relative rotations, and the inner housing is placed on the upper tray. Thus, a weight of the inner housing is evenly distributed onto plane surfaces of the upper and lower trays, and the sliding tracks and the sliding frames, thereby providing the operation box with a firmer structure for preventing deformation and swaying thereof.

1 Claim, 4 Drawing Sheets

FLEXIBLE AND ROTATABLE WALL-HANGING OPERATION BOX

BACKGROUND OF THE INVENTION (a) Field of the Invention

The invention relates to a flexible and rotatable wall-hanging operation box, and more particularly, to a flexible and rotatable wall-hanging operation box that is free from swaying and deformation during stretching, retracting and rotating movements thereof.

(b) Description of the Prior Art

Common industrial computers, communication equipments or other electronic devices, in order to provide maintenance and operation conveniences, are frequently disposed in an operation box. A prior operation box is generally a sealed pentagonal metal body having a front entrance pivotally disposed at a front opening thereof. An interior of the operation box is provided with a plurality of transverse or longitudinal racks, which are placed with elements such as wires discs and electronic devices thereon. However, most plugs, terminals, wire connections and heat dissipating systems (fans) are often installed behind the operation box. Therefore, a common operation box is stored with its rear surface located next to a wall in order to put the operation box to use. To carry out tasks like wiring, assembling new parts, dismantling malfunction objects and maintenance, the operation box is pulled out or even slanted at a certain angle to clear a space, so that a maintenance person can reach the rear surface of the operation box for carrying out maintenance or replacing parts. It is obvious that, when moving the operation box, inconveniences are caused for that not only wires are likely dragged but also apparatus and objects that were originally neatly arranged nearby are made messy.

In view of the aforesaid drawbacks of the prior operation box, a flexible and rotatable operation box structure shown in FIG. 4 has become available. The flexible and rotatable operation box comprises an outer housing 10 and an inner housing 20. The outer housing 10 is a sealed pentagonal body having an opening 11. The inner housing 20 has an interior thereof for accommodating and installing electronic devices. The flexible and rotatable operation box further has a rotating pivotal axis 30, a sliding frame 41 and a sliding track 42 at a lower portion thereof. Wherein, the sliding frame 41 is fixed at an inner lower portion of the outer housing 10 and is extended with a certain distance from the opening 11. The sliding track 42 has one end thereof fastened below the rotating pivotal axis 30 at the lower portion of the inner housing 20, the other end thereof slightly stretched out to an exterior, and two lateral sides thereof inlaid with anti-slip locating plates 43.

According to the aforesaid structure, the inner housing 20 is rotated using the rotating pivotal axis 30. However, the rotating pivotal axis 30 is located only at a point at the lower portion of the inner housing 20, and is merely a rotating axis in form of a supporting post. Therefore, forces that rotate the inner housing 20 are entirely received by the rotating pivotal axis 30, such that the rotating pivotal axis 30 is liable to damages. Moreover, for that the sliding track 42 is fastened below the rotating pivotal axis 30 at the lower portion of the inner housing 20, only a center portion of the inner housing 20 is supported by the sliding track 42 and the rotating pivotal axis 30. It is to be noted that, when arranging electronic devices in the inner housing 20, an overall weight is not always balanced. Supposed an overall weight of the inner housing 20 is unbalanced, the inner housing 20 may become oblique, and the sliding track 42 and the rotating pivotal axis 30 may subsequently become deformed. Because fulcrums formed are not evenly distributed at a periphery of the lower portion of the inner housing 20, swaying is also resulted when pulling and rotating the inner housing 20, and thus incurring inconveniences and perplexities to users.

SUMMARY OF THE INVENTION

Therefore, to overcome the aforesaid drawbacks, the primary object of the invention is to provide a flexible and rotatable wall-hanging operation box, which is free from swaying during stretching, retracting and rotating movements thereof, thereby maintaining stability of the operation box. Thus, the operation box according to the invention has characteristics of offering better safety and work efficiency.

To accomplish the aforesaid object, a flexible and rotatable wall-hanging operation box comprises an outer housing and an inner housing. The invention is characterized that, two lower sides at an interior of the outer housing are respectively disposed with a sliding frame and a sliding track, between the left and right sliding tracks are upper and lower trays that are capable of relative rotations, and the inner housing is placed on the upper tray. According to the aforesaid structure, the inner housing can be stored in the outer housing, or can be pulled out of the outer housing using the sliding tracks and the sliding frames to perform rotations. For that the upper and lower trays have relatively large areas, and distances between the sliding tracks and the sliding frames are relatively large as well, a weight of the inner housing is evenly distributed onto tray surfaces of the upper and lower trays, and the sliding tracks and the sliding frames, thereby providing the operation box with a firmer structure for preventing deformation and swaying thereof.

DETAILED DESCRIPTION OF THE PREFERRED EMBODIMENTS

To better understand contents of the invention, detailed descriptions shall be given with the accompanying drawings below.

Figure 1:
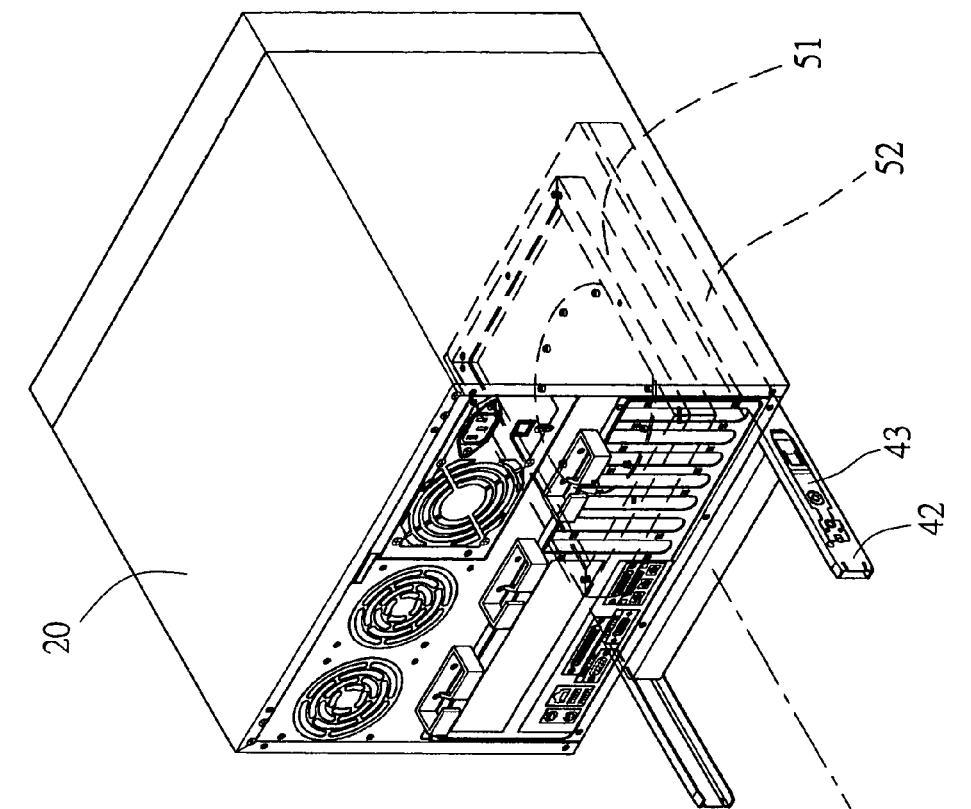
FIG. 1 shows a side view according to the invention.
Figure 2:
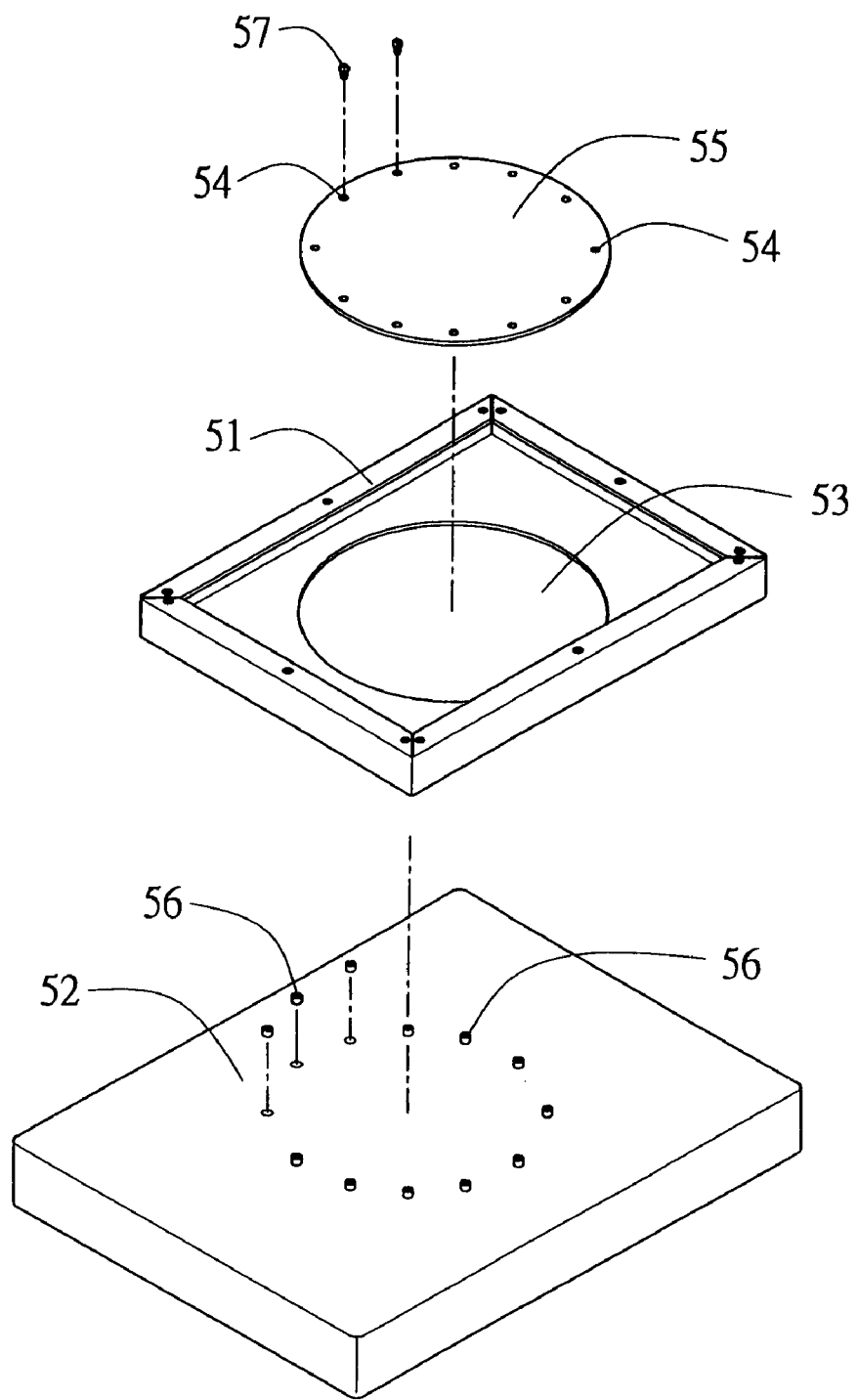
FIG. 2 shows an exploded partial elevational view according to the invention.
Figure 3:
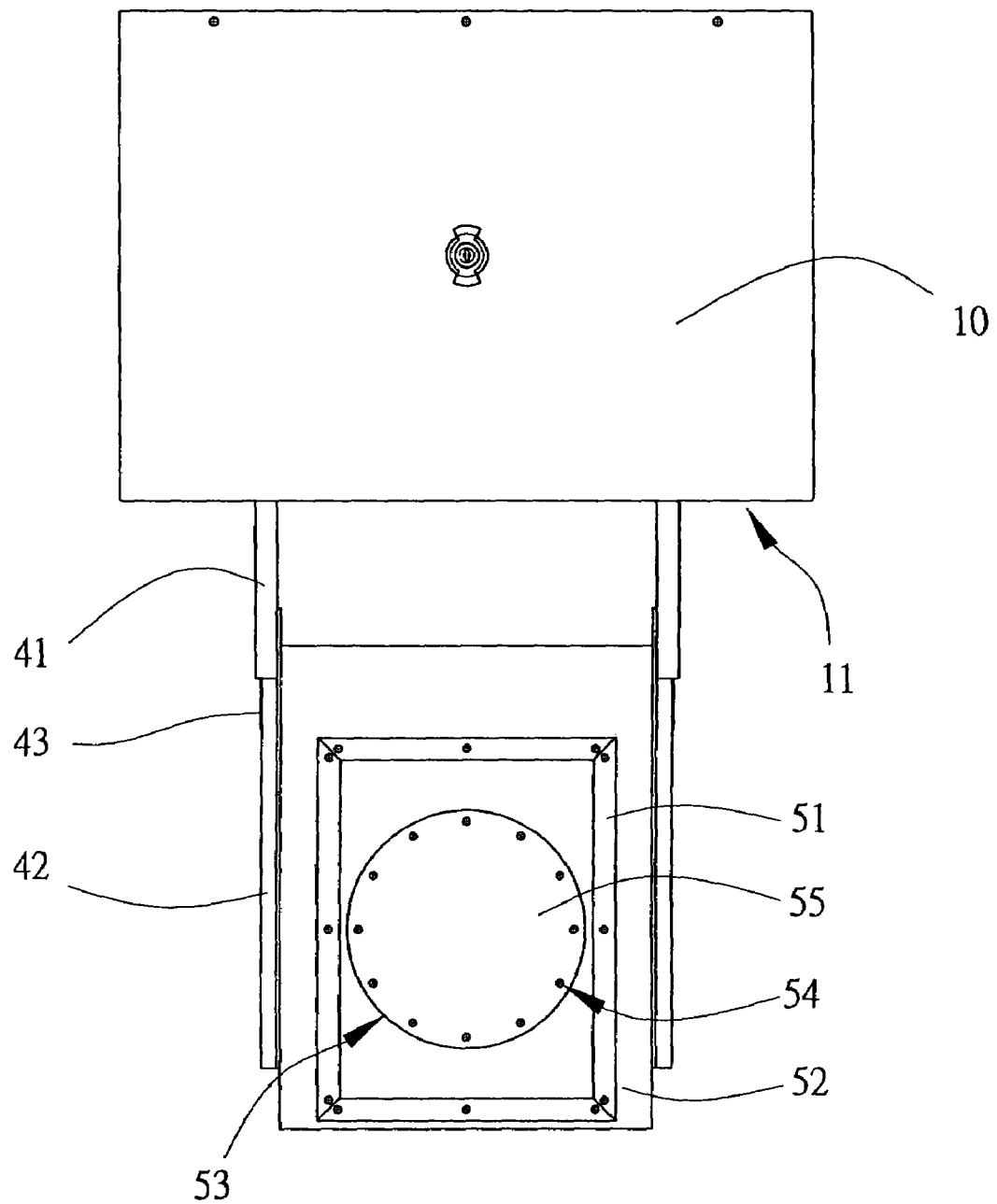
FIG. 3 shows a partial top view according to the invention.
Figure 4:
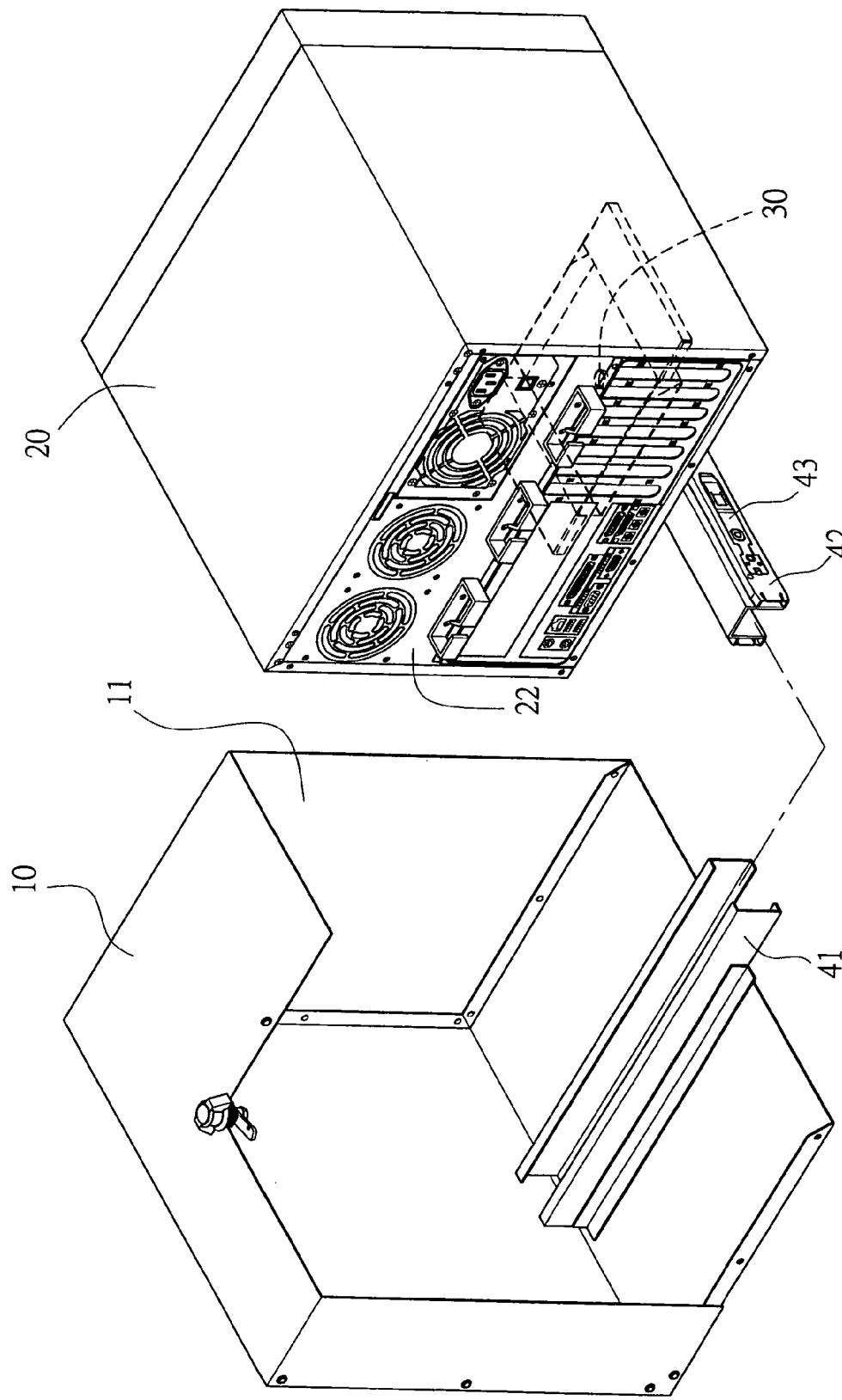
FIG. 4 shows an exploded elevational view of a prior art.

Referring to FIGS. 1, 2 and 3, a flexible and rotatable wall-hanging operation box according to the invention comprises an outer housing 10 and an inner housing 20. The outer housing 10 is a sealed pentagonal body having an opening 11. The inner housing 20 has an interior thereof for accommodating and installing electronic devices.

The invention is characterized that, two lower sides of an interior of the outer housing 10 are respectively disposed with a sliding frame 41 and a sliding track 42. Each of the sliding frames 41 is extended with a certain distance from the opening 11. Between the left and right sliding tracks 42 is a lower tray 52 having a plurality of screw openings 56 arranged along a periphery of a tray surface of the lower tray 52. An upper tray 51 is formed with a round opening 53 having a circumference slightly larger than that formed by the plurality of screw openings 56, and is also formed with a circular turning disc 55 having a circumference slightly larger than that of the round opening 53. The circular turning disc 55 has through holes 54 for corresponding to the screw openings 56. For assembly, the round opening 53 of the upper tray 56 is placed upon and within a range defined by the screw openings 56, and is fastened by screwing screws 57 through the through holes 54 to the screw openings 56, such that the upper tray 51 is enable to freely rotate between the circular turning disc 55 and the lower tray 52. The inner housing 20 is then fixed on the upper tray 51.

According to the aforesaid structure, the inner housing 20 can be withdrawn out of or stored into the outer housing 10 using the sliding tracks 42 and the sliding frames 41. In addition, the withdrawn outer housing 10 is capable of free rotations. Thus, the flexible and rotatable wall-hanging operation box utilizes entire plane surfaces of the upper tray 51 and the lower tray 52 for rotation as well as serving force-receiving planes that bear an overall weight. A weight of the inner housing 20 is also evenly distributed to the sliding tracks 42 and the sliding frames 41 at the two lateral sides, and swaying of the inner housing 20 is effectively prevented. Therefore, the aforesaid structure is firm and deformation-resistant while providing smoother withdrawn and rotating movements.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A flexible and rotatable wall-hanging operation box comprising an outer housing and an inner housing; wherein, the outer housing is a sealed pentagonal body having an opening, and the inner housing has an interior thereof for accommodating and installing electronic devices; and being characterized that, two lower sides of an interior of the outer housing are respectively disposed with a sliding frame and a sliding track; each of the sliding frames is extended with a certain distance from the opening; between the left and right sliding tracks is a lower tray having a plurality of screw openings arranged along a periphery of a tray surface thereof; an upper tray is formed with a round opening having a circumference slightly larger than that formed by the plurality of screw openings, and is also formed with a circular turning disc having a circumference slightly larger than that of the round opening; the circular turning disc has through holes for corresponding to the screw openings; for assembly, the round opening of the upper tray is placed upon and within a range defined by the screw openings, and is fastened by screwing screws through the through holes to the screw openings, such that the upper tray enable to freely rotate between the circular turning disc and the lower tray; and the inner housing is then fixed on the upper tray.

\* \* \* \* \*